US011264521B2

(12) United States Patent
Voutilainen et al.

(10) Patent No.: US 11,264,521 B2
(45) Date of Patent: Mar. 1, 2022

(54) PHOTOSENSITIVE FIELD-EFFECT TRANSISTOR

(71) Applicant: EMBERION OY, Espoo (FI)

(72) Inventors: Martti Voutilainen, Espoo (FI); Sami Kallioinen, Espoo (FI); Juha Rakkola, Espoo (FI)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 16/771,743

(22) PCT Filed: Dec. 12, 2018

(86) PCT No.: PCT/FI2018/050906
§ 371 (c)(1),
(2) Date: Jun. 11, 2020

(87) PCT Pub. No.: WO2019/115876
PCT Pub. Date: Jun. 20, 2019

(65) Prior Publication Data
US 2021/0074869 A1    Mar. 11, 2021

(30) Foreign Application Priority Data

Dec. 12, 2017 (FI) .................................... 20176109

(51) Int. Cl.
*H01L 21/00* (2006.01)
*H01L 31/101* (2006.01)
(Continued)

(52) U.S. Cl.
CPC .... *H01L 31/035218* (2013.01); *H01L 31/028* (2013.01); *H01L 31/022408* (2013.01); *H01L 31/1136* (2013.01); *H01L 51/428* (2013.01)

(58) Field of Classification Search
CPC ......... H01L 31/022408; H01L 31/0264; H01L 31/035218
(Continued)

(56) References Cited

U.S. PATENT DOCUMENTS 4,896,200 A    1/1990 Seki et al.
6,589,848 B1   7/2003 Hwang et al.
(Continued)

FOREIGN PATENT DOCUMENTS

EP    0 631 327 A2    12/1994
EP    3 136 445 A1     3/2017
(Continued)

OTHER PUBLICATIONS

International Search Report and Written Opinion dated Mar. 29, 2019 corresponding to International Patent Application No. PCT/FI2018/050906.
(Continued)

*Primary Examiner* — Calvin Lee
(74) *Attorney, Agent, or Firm* — Squire Patton Boggs (US) LLP

(57) ABSTRACT

A photosensitive field-effect transistor which can be configured to provide an electrical response when illuminated by electromagnetic radiation incident on the transistor. The field-effect transistor has a channel (13) made from a two-dimensional material and comprises a photoactive layer (22) which can be configured to donate charge carriers to the transistor channel (13) when electromagnetic radiation is absorbed in the photoactive layer (22). The photosensitive field-effect transistor comprises a top electrode (21) which is in contact with the photoactive layer on one or more contact areas which together form a contact pattern. With a suitably patterned top electrode (21), a voltage applied to the electrode can function as an electrical shutter which can switch (Continued)

the photosensitive field-effect transistor between a light-sensitive state and a light-immune state.

12 Claims, 11 Drawing Sheets

(51) Int. Cl.
*H01L 31/0352* (2006.01)
*H01L 31/0224* (2006.01)
*H01L 31/028* (2006.01)
*H01L 31/113* (2006.01)
*H01L 51/42* (2006.01)

(58) Field of Classification Search
USPC .................. 257/428, 462; 438/57, 59–60
See application file for complete search history.

(56) References Cited

U.S. PATENT DOCUMENTS

| | | | |
|---|---|---|---|
| 9,293,627 B1* | 3/2016 | Beechem | H01L 31/0232 |
| 9,599,770 B2* | 3/2017 | Englund | G02F 3/022 |
| 10,070,083 B2* | 9/2018 | Konstantatos | H01L 27/14645 |
| 2002/0017609 A1 | 2/2002 | Danielsson | |
| 2009/0152664 A1 | 6/2009 | Klem et al. | |
| 2009/0256060 A1 | 10/2009 | Meynants et al. | |
| 2013/0032782 A1 | 2/2013 | Gerasimos et al. | |
| 2017/0207355 A1 | 7/2017 | Beiley et al. | |
| 2019/0296178 A1* | 9/2019 | Bessonov | H01L 31/1136 |

FOREIGN PATENT DOCUMENTS

| | | |
|---|---|---|
| EP | 3 240 044 A1 | 11/2017 |
| EP | 3 252 831 A1 | 12/2017 |
| EP | 3 429 190 A1 | 1/2019 |
| JP | S61 276274 A | 12/1986 |

OTHER PUBLICATIONS

Finnish Search Report dated Jul. 4, 2018 corresponding to Finnish Patent Application No. 20176109.
Ivan Nikitskiy et al: "Integrating an electrically active colloidal quantum dot photodiode with a graphene phototransistor," Nature Communications, vol. 7, Jun. 17, 2016, p. 11954, XP055303516.
Stijn Goossens et al: "Broadband image sensor array based on graphene-CMOS integration," Nature Photonics, vol. 11, No. 6, May 29, 2017, pp. 366-371, XP055569932.
F.H. L. Koppens et al: "Photodetectors based on graphene, other two-dimensional materials and hybrid systems." In: Nature Nanotechnology. Nature Publishing Group. Oct. 6, 2014, vol. 9, pp. 780-793.

* cited by examiner

PHOTOSENSITIVE FIELD-EFFECT TRANSISTOR

FIELD OF THE DISCLOSURE

This disclosure relates to field-effect transistors prepared on the surface of a substrate, and more particularly to field-effect transistors which can be used for detecting the intensity of electromagnetic radiation. The present disclosure further concerns methods for measuring electromagnetic radiation with such field-effect transistors, and methods for resetting such field-effect transistors between successive measurements.

BACKGROUND OF THE DISCLOSURE

Field-effect transistors which utilize two-dimensional materials in the transistor channel can be used as versatile detectors of electromagnetic radiation at wavelengths ranging from infrared to ultraviolet. Such transistors may be called photosensitive transistors, or phototransistors. A graphene field-effect transistor (GFET), for example, comprises a semiconducting graphene channel whose conductivity increases when it is illuminated by electromagnetic radiation. This increased conductivity can be measured, and strongly amplified, in a field-effect transistor geometry where the current through the channel is controlled by a gate voltage applied to the gate electrode. The same effect can be generated with other two-dimensional channel materials.

The sensitivity of photosensitive transistors which utilize two-dimensional channel materials can be increased by placing a photoactive layer adjacent to the channel. Such photoactive layers can donate extra charge carriers to the channel when they are released in the photoactive material by electromagnetic radiation. This process may be called charge multiplication or charge modulation. Photoactive layers can also expand the spectral response of photosensitive transistors to a broader wavelength range.

Quantum dot materials (which may also be called semiconductor nanocrystals) can be used in photoactive layers. When electromagnetic radiation is absorbed in the quantum dots, the photogenerated charges can be separated at the interface between the quantum dot material and the transistor channel, so that one charge-carrier type is trapped in the quantum dots while another carrier type is transferred to the channel. The absorption of electromagnetic radiation in the quantum dots thereby changes the conductivity of the channel by inducing an increase or decrease in free charges in the channel.

Photoactive layers may be approximately 10-500 nm thick. Light absorption in the photoactive layer increases with thickness. However, charges released from quantum dots lying far from the channel are less likely to reach the channel than charges released nearby. Electrically passive photoactive layers can be made electrically active by sandwiching the photoactive layer between the channel and an electrode. The bias voltage provided by the electrode may facilitate the use of thicker photoactive layers.

Photodetectors typically use correlated double-sampling (CDS) to reduce noise in the measurement of radiation intensity. CDS is particularly important for reducing flicker noise (1/f noise). The CDS method includes one measurement of detector response under illumination and another measurement of detector response when it is not illuminated. In order for the CDS-method to be useful, the noise conditions should be as equal as possible in these two measurements. The measurement under illumination should therefore be conducted as soon as possible after the corresponding non-illuminated measurement, or vice versa.

To generate illuminated and non-illuminated states in quick succession, a shutter mechanism is needed. The mechanism may, for example, be a mechanical shutter or liquid crystal shutter which modulates incident light on and off. A mechanical shutter may for example be implemented with a spinning obstacle on the light path, which can be quickly switched between a light-blocking position and a light-releasing position. However, there are several applications where mechanical shutters and liquid crystal shutters are not feasible due to size, noise, durability or other design considerations. Furthermore, in many photodetectors these shutters can only perform an incomplete reset. If charge dissipation occurs with a time-constant longer than the dark period, the effects of light exposure in one frame may be carried over to both dark and light states in subsequent frames.

It would be preferable to use electrical shutters in photosensitive transistor devices. Electrical shutters are known from photodetectors which utilize photodiodes. Document US20090256060 discloses a photodiode array with an electrical shutter which resets photodiodes by removing stored charge to capacitors.

However, it is not possible to use similar electrical shutters in photodetectors based on field-effect transistors which utilize two-dimensional materials and semiconducting photoactive layers, because the removal of charge from the photodetector channel does not remove the charge which is stored in the photoactive layer.

BRIEF DESCRIPTION OF THE DISCLOSURE

An object of the present disclosure is to provide an electrical shutter for photodetectors based on field-effect transistors which utilize two-dimensional channel materials in contact with semiconducting photoactive layers.

The objects of the disclosure are achieved by a method and an arrangement which are characterized by what is stated in the independent claims. The preferred embodiments of the disclosure are disclosed in the dependent claims.

The disclosure is based on the idea of using a patterned second gate electrode on the photoactive layer. An advantage of the method and the arrangement of this disclosure is that the second gate electrode can be used to reset a field-effect phototransistor electrically.

This electrical reset always resets a photosensitive transistor pixel to a known electrical state, so that even non-ideal effects with long time-constants are quickly neutralized. The reset time is short, which facilitates the use of the CDS method and a high frame rate in light detection applications.

In other words, by combining photodiode and phototransistor functionalities into an integrated entity, it is possible to control the charge in the photoactive material. Photogenerated electrons and holes can be removed from photoactive layers with a bias voltage between the second gate electrode and the channel. The charge neutrality of the photoactive material can thereby be preserved even when it is illuminated.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
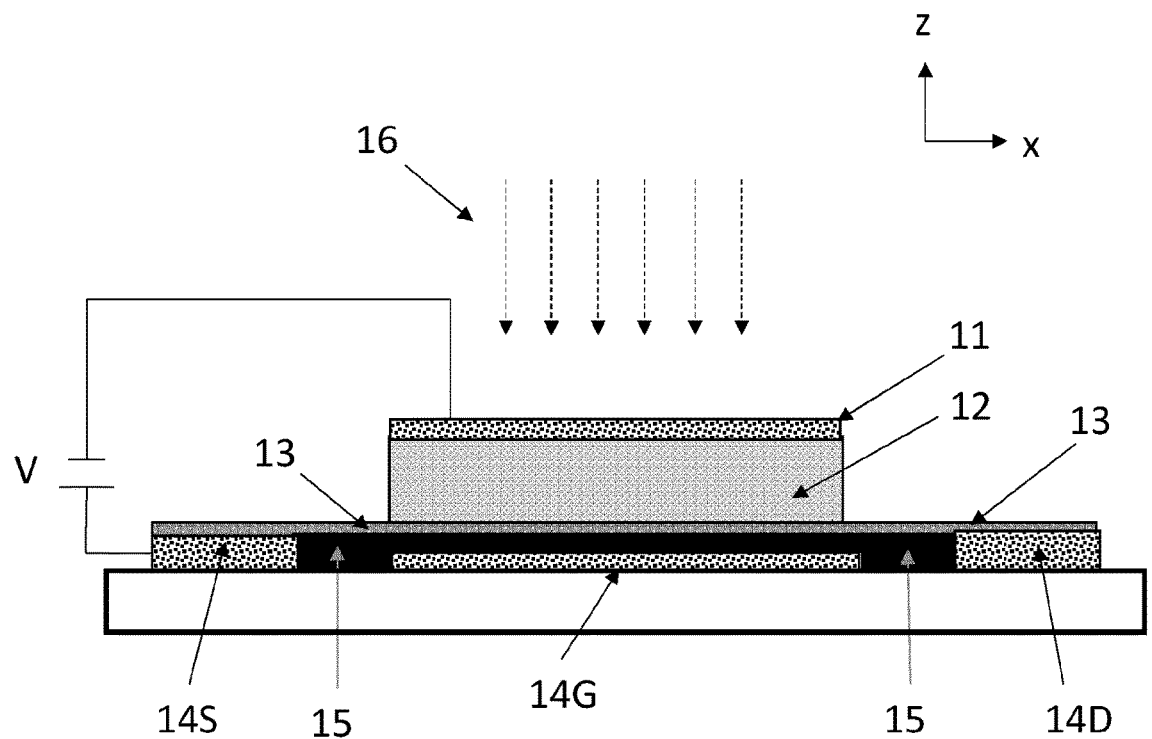
FIG. 1 illustrates a photosensitive field-effect transistor which comprises a photoactive layer.

It is known that the flow of charge carriers from a photoactive layer to a channel of two-dimensional material in an illuminated photosensitive field-effect transistor can be altered with an external bias. The flow current depends on the magnitude and the direction of the bias voltage. FIG. 1 illustrates schematically a photosensitive field-effect transistor which comprises source (14S), drain (14D) and gate (14G) electrodes on the surface of a substrate, a channel (13) deposited on the surface and an insulating layer (15) between the first gate electrode (14G) and the channel (13). The transistor also comprises a photoactive layer (12) which partly covers the channel (13), and a second gate electrode (11) which covers the photoactive layer (12). Electromagnetic radiation (16) illuminates the photosensitive transistor.

A bias voltage V applied between the second gate electrode 11 and the channel 13 can alter the electrical characteristics of the interface between the photoactive layer 12 and the channel 13. The alteration depends on the direction of the bias voltage and one the electrical properties of the junction between the channel and the photoactive layer. In this disclosure, the term "forward bias" refers to a situation where the bias voltage V sets the channel 13 to a higher potential than the second gate electrode 11. The term "reverse bias", on the other hand, refers to a situation where the bias voltage V sets channel 13 to a lower potential than the second gate electrode 11. The bias voltage may be applied to the channel 13 for example through the source electrode 14S, as illustrated in FIG. 1.

The source-drain voltage is typically so low that for practical purposes the electrical potential of the channel is nearly equal to the potential of the source electrode.

Two states are possible when the junction is biased and the transistor is illuminated. They may be called the light-sensitive state and the light-immune state, respectively. In the light-sensitive state, the channel 13 comprises many available states for charge carriers released in the photoactive layer by electromagnetic radiation. These charge carriers will then be readily transferred to the channel. Since the photoactive layer absorbs much more photons than the graphene layer does, the number of light-induced charge carriers in the channel is multiplied. Depending on the charge-carrier type, the source-drain current either decreases or increases. The source-drain current thereby becomes dependent on light-intensity. In the light-immune state, the channel comprises few available states for charge carriers released in the photoactive layer by electromagnetic radiation. The charge carriers released by electromagnetic radiation are prevented from transferring into the channel. Most charge carriers released in the photoactive layer will recombine with charge carriers of the opposite type within the photoactive layer. No multiplication of light-induced charge carriers occurs in the channel. The source-drain current is then nearly independent of light-intensity.

If, for example, the photoactive material comprises PbS quantum dots, and if the channel material is graphene, the charge multiplication process comprises hole transfer from the PbS layer to the graphene. Reverse bias lifts the Fermi-level of graphene and thereby opens up a large number of states into which holes can be injected. At sufficiently high reverse bias, the source-drain current measured from the photosensitive transistor is limited by the rate at which charge carriers are released in the photoactive PbS layer. This current thereby becomes proportional to light intensity. The transistor is thereby set to a light-sensitive state by the reverse bias.

On the other hand, under forward bias the quasi-Fermi-level for holes in graphene becomes equal to the quasi-Fermi-level of holes in the PbS layer, which stops the injection of holes from the photoactive PbS layer to the graphene channel. Holes then recombine with electrons in the PbS layer, and the source-drain current through the channel becomes almost independent of light intensity. The transistor is thereby set to a light-immune state by the forward bias.

The bias required for setting the photosensitive transistor to a light-sensitive state depends on the channel material, the photoactive material and on the electrical properties of the junction between these materials. The bias required for the light immune state is then the opposite.

In other words, depending on the selected materials, the light-sensitive state may be obtained when the 12/13 junction is forward-biased, or it may be obtained when the 12/13 junction is reverse-biased. Correspondingly, the light-immune state may be obtained when the 12/13 junction is reverse-biased, or it may be obtained when the 12/13 junction is forward-biased.

The light-sensitive state may also be called an illuminated state, a light-on state, or a light state. The light-immune state may also be called a non-illuminated state, a light-off state, or a dark state. However, it should be noted that the photosensitive transistor is exposed to the same illumination in the light-immune state as in the light-sensitive state (assuming that these states occur in quick succession). The term "dark state" only means the transistor behaves approximately as if it was in the dark. The electrical shutter turns the light response off by preventing the charge multiplication which the photoactive layer would otherwise induce in the transistor layer. It turns the light response on by allowing this multiplication. In the light-immune state, the photoactive layer still absorbs electromagnetic radiation, and this radiation releases charge carriers in the photoactive layer. However, in the light-immune state these charge carriers recombine in the photoactive layer without influencing the channel.

In other words, the interface between the channel layer and the photoactive layer can be made responsive to incident electromagnetic radiation, or non-responsive to the radiation, by applying a suitable bias voltage between the channel and the second gate electrode. The bias voltage may be an AC-voltage, so that it can alternate between the light state and the dark state relatively quickly.

However, when a bias voltage V is applied to the second gate electrode illustrated in FIG. 1, the voltage may easily couple to the channel either capacitively or resistively. If the capacitance between the second gate electrode 11 and the channel 13 is high, a high bias voltage may capacitively attract a lot of charge-carriers of an unwanted type to the 12/13 interface. There may also exist a direct current from the second gate electrode 11 to the channel 13 if the photoactive material 12 allows it. The separation between a light-sensitive state and a light-immune state can be nullified by such capacitive and resistive effects.

This disclosure describes a photosensitive field-effect transistor which can be configured to provide an electrical response when illuminated by electromagnetic radiation incident on the transistor. The photosensitive field-effect transistor comprises at least one electrically conducting source electrode and at least one electrically conducting drain electrode, and a layer of two-dimensional material which forms a horizontal transistor channel configured to transport current between the at least one source electrode and the at least one drain electrode. The photosensitive field-effect transistor further comprises at least one horizontal electrically conducting first gate electrode which overlies or underlies the transistor channel on a first side of the transistor channel, and at least one gate-insulating layer between the first gate electrode and the transistor channel.

The photosensitive field-effect transistor also comprises a horizontal photoactive layer with a first horizontal surface and a second horizontal surface, wherein at least a part of the first horizontal surface of the photoactive layer is in contact with a second side of the transistor channel, and the photoactive layer can be configured to donate charge carriers to the transistor channel when electromagnetic radiation is absorbed in the photoactive layer. The photosensitive field-effect transistor also comprises a second gate electrode which is in contact with the second horizontal surface of the photoactive layer on one or more contact areas, whereby the contact areas together form a contact pattern on the second horizontal surface of the photoactive layer.

This disclosure also describes a photodetector which comprises at least one photosensitive field-effect transistor described in this disclosure. The photodetector also comprises a voltage source connected between the channel and the second gate electrode in the at least one photosensitive field-effect transistor, and the photodetector comprises a control unit which is configured to operate an electrical shutter on the at least one photosensitive field-effect transistor by switching the photosensitive field-effect transistor between a light-sensitive state and a light-immune state by applying to the transistor a bias voltage through the voltage source.

The photosensitive field-effect transistors may form pixels in the photodetector, and one photodetector may comprise hundreds or thousands of pixels. The control unit may be configured to control the state of each transistor separately, or to control the state of all transistors together. The same voltage source may be connected between the channels and gate electrodes of multiple photosensitive field-effect transistors. Alternatively, the photodetector may comprise several voltage sources connected to different photosensitive field-effect transistors.

In this disclosure, the term "horizontal" refers to the plane defined by a substrate, which will also be called the xy-plane in this disclosure. The term "vertical" refers to the z-direction which is illustrated, for example, in FIG. 1. A "horizontal" layer is therefore parallel to the substrate plane. However, terms such as "horizontal layer" do not mean that the entire layer necessarily lies precisely in the same horizontal plane. The layer may, for example, have been deposited over other layers, and it may comprise vertical steps determined by the underlying layers. The term "horizontal" merely indicates that the primary orientation of the layer is determined by the substrate plane. Furthermore, terms such as "vertical" and "horizontal" do not imply anything about the orientation of the substrate when the device is manufactured, or when the device is in use. The device and the substrate may be oriented in any suitable direction during usage and manufacturing, for example sideways in such a manner that a layer which is in this disclosure referred to as "horizontal", becomes vertical. In other words, the terms "horizontal" and "vertical" merely define two orthogonal directions, one of which is parallel to the substrate surface, and the other of which is normal to this surface.

In this disclosure, the verbs "overlie" and "underlie" refer to vertical alignment without direct contact. When a first layer "overlies" or "underlies" a second layer, the first layer and the second layer are vertically aligned, but they are not in direct contact with each other. In other words, the two layers have both been deposited on a given area of the substrate, but a third intervening layer has been deposited between them. These three layers are all vertically aligned.

In this disclosure, the verb "cover" refers to vertical alignment with direct contact. When a first layer "covers" a second layer, the first layer and the second layer are vertically aligned, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

In addition to direct physical contact, the term "in contact with" can in this disclosure also mean electrical contact without direct physical contact. In other words, when the photoactive layer, or a portion of the photoactive layer, is in contact with the transistor channel, the photoactive layer can be physically separated from the transistor channel by an intermediate layer, but still be in contact with the transistor channel because the intermediate layer is sufficiently thin to allow charge carriers to pass through it. For example, the intermediate layer may be a host material wherein the semiconductor nanocrystals are embedded, or it may be a thin insulating or photoactive layer on the surface of the transistor channel. If charge carriers can pass through the intermediate layer, for example by tunnelling, then the semiconducting material may still be considered to be "in contact with" the transistor channel.

In this disclosure, the term "first gate electrode" refers to the gate electrode which is separated from the channel only by an insulating layer. This electrode may also be referred to as the "back gate electrode". The term "second gate electrode" refers to the gate electrode which is separated from the channel by the photoactive layer. This electrode may also be referred to as the "top gate electrode".

Figure 2:
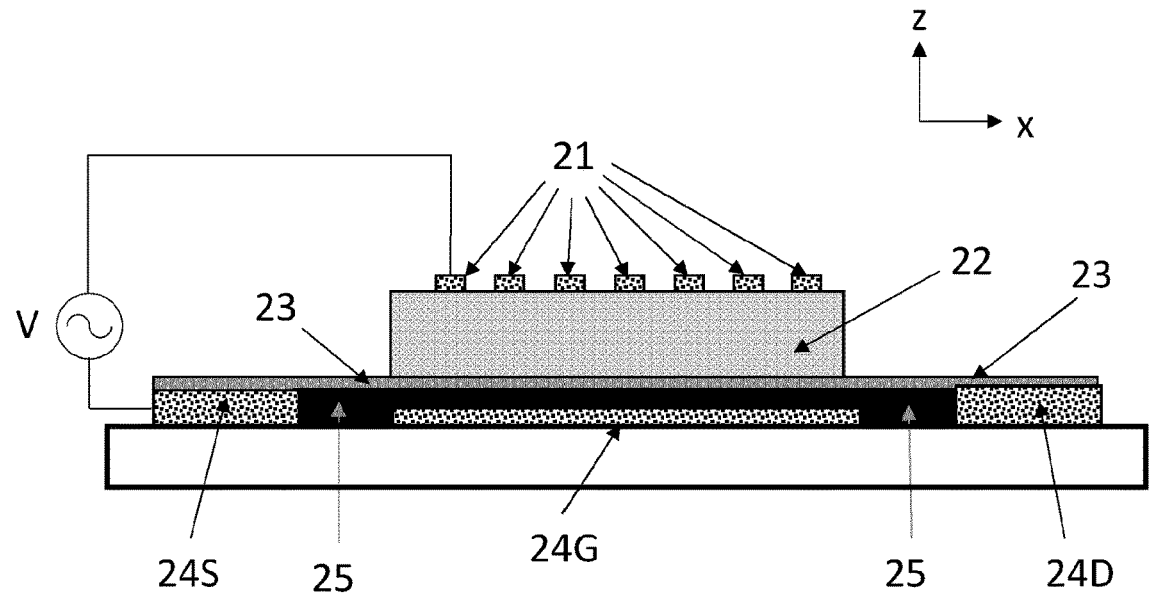
FIGS. 2-4 illustrate photosensitive field-effect transistors with patterned electrodes.

FIG. 2 illustrates a photosensitive field-effect transistor where reference numbers 22, 23, 24S, 24G, 24D and 25 correspond to reference numbers 12, 13, 14S, 14G, 14D and 15 in FIG. 1, respectively. In this case the first gate electrode 24G underlies the channel 23, the photoactive layer 22 at least partly covers the channel 23, and the second gate electrode 21 at least partly covers the photoactive layer 22. The second gate electrode 21 forms a pattern on the upper surface of the photoactive layer 22. The different parts of the patterned second gate electrode 21 are electrically connected, so that a bias voltage V applied to one part of the pattern spreads across the entire pattern. The electrode 21 may extend across the horizontal edge of the photoactive layer 22 at one or more points (not illustrated), so that it can be joined to a main electrode connected to electrical circuits on the substrate. Figures illustrating vertical cross-sections, such as FIG. 2, have not been drawn to scale in this disclosure.

Figure 3:
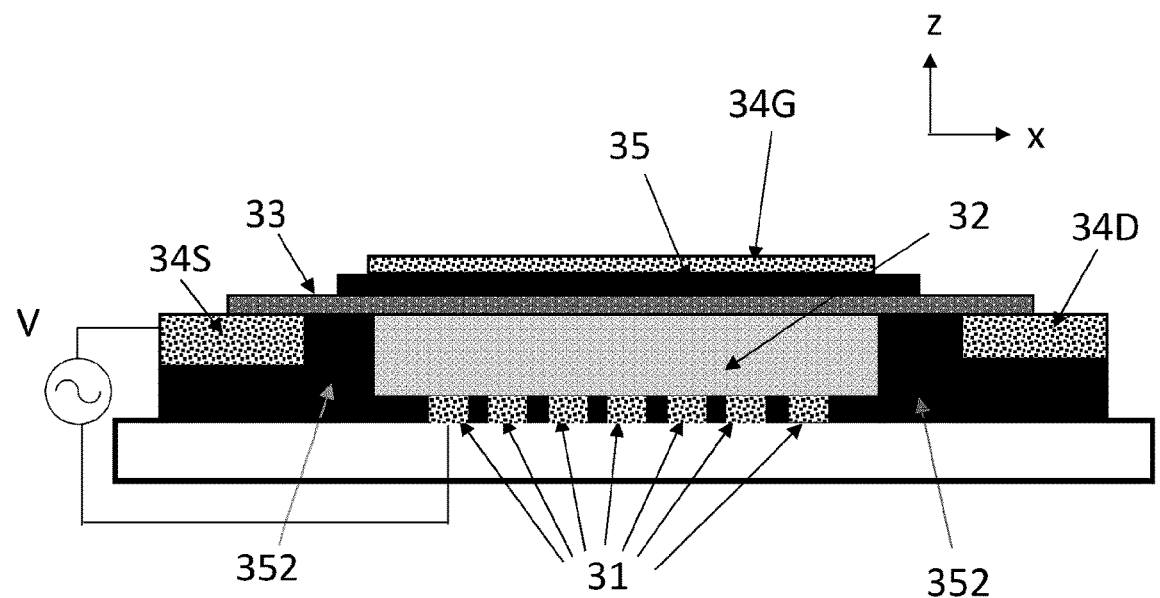

FIG. 3 illustrates an alternative configuration where reference numbers 32, 33, 34S, 34G, 34D and 35 correspond to reference numbers 12, 13, 14S, 14G, 14D and 15 in FIG. 1, respectively. The first gate electrode 34G overlies the channel 33, the channel 33 covers the photoactive layer 32, and the photoactive layer 32 covers the second gate electrode 31. In this case the second gate electrode 31 forms a pattern on the lower surface of the photoactive layer 32. The electrodes below the channel may, for example, be embedded in an insulating layer 352. Again, the electrode 31 may extend across the horizontal edge of the photoactive layer 32 at one or more points. Such points are not illustrated in FIG. 3.

The junction between the channel and the photoactive layer should preferably be a Schottky junction, while the junction between the photoactive layer and the second gate electrode may be an ohmic junction. The electrical characteristics of the junction depend on the materials chosen for the channel and the photoactive layer. The material most suitable material for the second gate electrode may also depend on the doping-level of the photoactive layer, and/or on ligands that are present in the photoactive layer. The material of the second gate electrode may, for example, be Au, Al, or a transparent conductor such as indium-tin-oxide (ITO).

Figure 4:
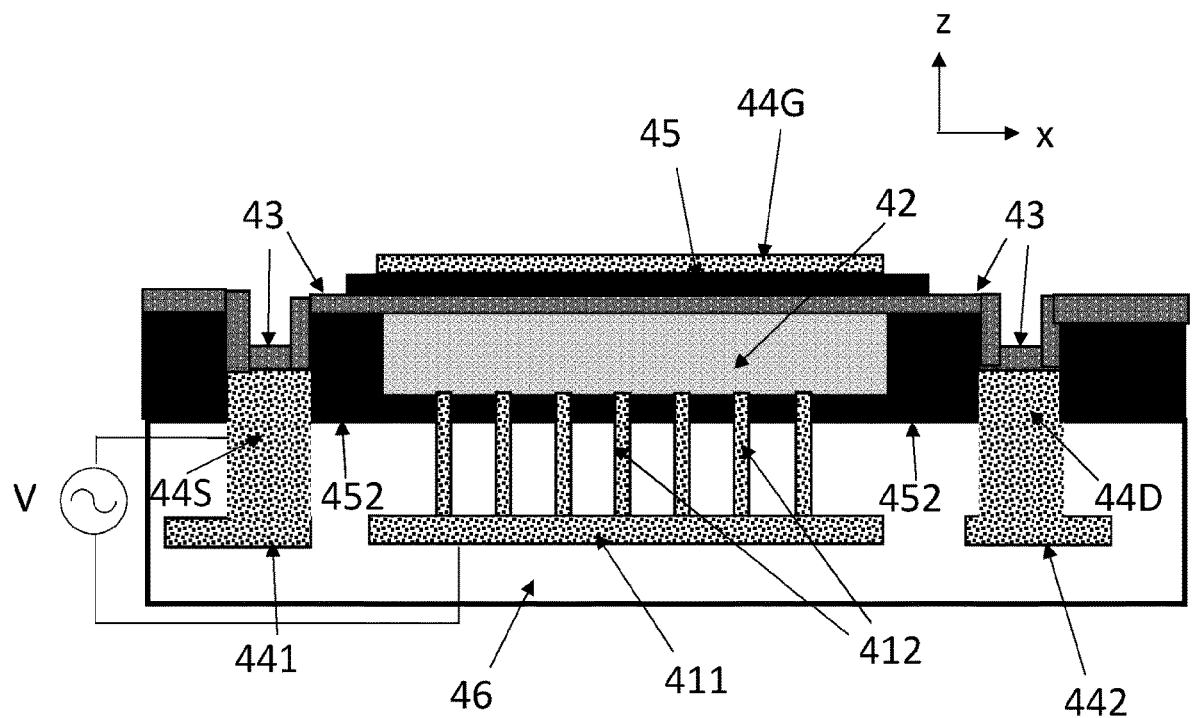

FIG. 4 illustrates a photosensitive transistor where the channel 43 covers the photoactive layer 42. Reference numbers 44G and 45 correspond to 34G and 35, respectively, in FIG. 3. The second gate electrode comprises a horizontal main electrode 411 which is embedded within the substrate 46. The second gate electrode also comprises a number of vertical gate electrode elements 412 which extend to the bottom surface of the photoactive layer 42. The contact areas are formed on those parts of the bottom surface which are in contact with the vertical gate electrode elements 412. The transistor elements which lie above the substrate surface may be formed on an insulating layer 452. Optionally, the source electrode 44S and drain electrode 44D can also be partly embedded within the substrate, as illustrated in FIG. 4. The embedded electrode elements 411, 441 and 442 may be joined to electrode lines which extend beneath several field-effect transistor pixels.

When the graphene layer overlies the photoactive layer and the second gate electrode, as in FIGS. 3 and 4, all the patterning steps which are required to form the second gate electrode can be performed before the graphene layer is deposited onto the substrate. This eliminates the risk of damaging the graphene layer during the patterning of the second gate electrode.

Figure 5:
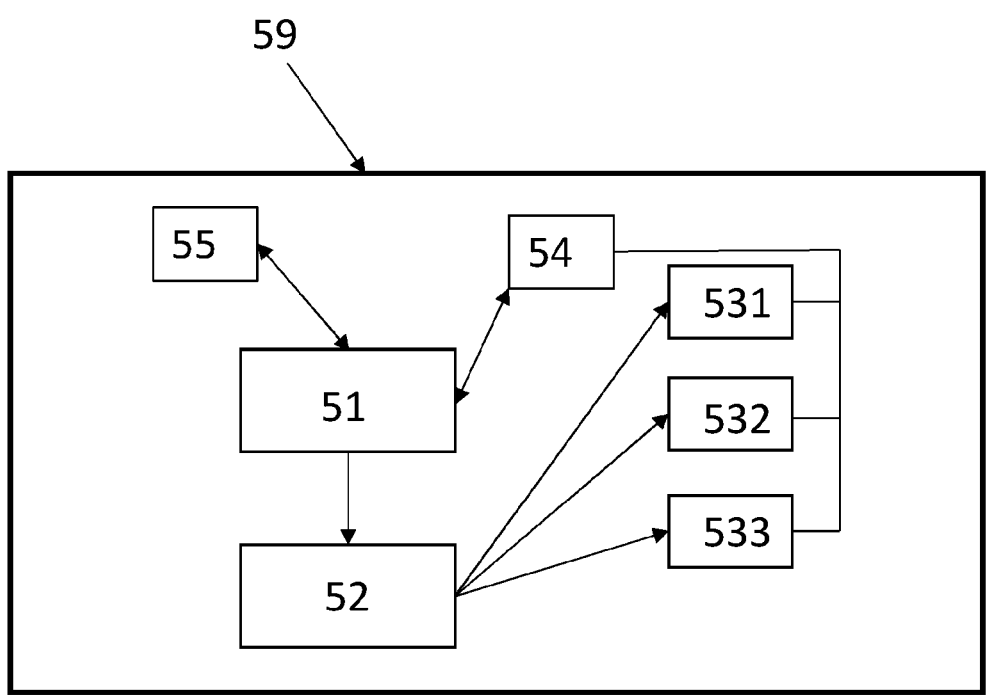
FIG. 5 illustrates a photodetector with an electrical shutter.

FIG. 5 illustrates schematically a photodetector 59 with an electrical shutter. The photodetector comprises a control unit 51, which may be a computer. The control unit 51 may be connected to a voltage source 52. The control unit 51 may be configured to alternately reverse bias and forward bias voltages to the one or more photosensitive field-effect transistors 531-533 (only three transistors are illustrated, but the photodetector may comprise many more). The bias voltage and the patterned second gate perform the function of an electrical shutter when they are suitably dimensioned, as will be described in more detail below. The photodetector 59 may also comprise a measurement unit 54. The control unit 51 may be configured to read response values from the photosensitive field-effect transistors through measurement unit 54. The photodetector 59 may also comprise a memory unit 55. The control unit 51 may be configured to read data from memory unit 55 and store new data in memory unit 55.

The photoactive layer (22, 32, 42) may comprise semiconductor nanocrystals or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, Si, graphene, or core/shell nanocrystals with any of the preceding core/shell constituents.

Alternatively, the photoactive layer (22, 32, 42) may comprise any of the preceding semiconductor nanocrystals or colloidal quantum dots embedded in a host material comprising metal chalcogenide, metal halide, or hybrid halide perovskite. The metal chalcogenide may have the general formula $ME_n$, where E is S, Se or Te, and it may for example be $AsS_x$, CdS, CdSe, CdTe, $CuInS_2$, $SnS_x$, $In_2Se$ or $Bi_2Te_3$. The metal halide may have the general formula $MX_n$, where M is Pb, Bi, Cd, In, Zn, Sn, Cu, Fe, Ga, Li or Sb and X is I, Br or Cl, and it may for example be Pb112 or Bi113. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may be in the range 2-20 nm.

The capping ligands on the semiconductor nanocrystals may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogenides (S, Se). Inorganic ligands may also include metal halides or metal chalcogenides.

The transistor channel (23, 33, 43) may comprise a layer of graphene. Alternatively, the channel may alternatively comprise one or more of a graphene-like material, a transition metal dichalcogenide, or another two-dimensional material. The graphene-like material may include phosphorene, silicene, germanene, stanene, GaN, InN, InP, InAs, BAs, BP, or GaP. The transition metal dichalcogenide may include $WE_2$, $MoE_2$, $ScE_2$, $TiE_2$, $Hf E_2$, $ZrE_2$, $VE_2$, $CrE_2$, $MnE_2$, $FeE_2$, $CoE_2$, $NiE_2$, $NbE_2$, $TcE_2$, $ReE_2$, $PdE_2$, or $PtE_2$, where E is S, Se or Te.

Patterning of the second gate electrode (21, 31, 41) reduces the contact area between the electrode and the photoactive layer (22, 32, 42). The capacitance between the second gate electrode (21, 31, 41) and the channel (23, 33, 43) is directly proportional to the contact area, and is thereby reduced by the patterning. This reduction in capacitive coupling allows the second gate electrode to be used as an electrical shutter. By setting a forward or reverse bias over the junction between the channel and the photoactive layer, the second gate electrode can electrically switch the photosensitive transistor between a light-sensitive state, where the light absorbed in the photoactive layer increases or decreases the source-drain current, and a light-immune state where any light absorbed in the photoactive layer has no, or almost no, effect on the source-drain current. A relatively small contact area is needed at the second gate electrode to reduce the capacitance between the second gate electrode and the channel. Otherwise the effect of the electrical bias may be nullified by capacitive coupling. However, the contact area must be sufficiently large, and the pattern sufficiently wide, to spread the bias voltage across the entire interface between the channel and the photoactive layer.

The photoactive layer has a first horizontal surface which is in contact with the channel, typically across the entire area of the first horizontal surface. The photoactive layer also has a second horizontal surface on its opposite side. The horizontal area of this second horizontal surface of the photoactive layer will be referred to as the photoactive area $A_{PHOTOACTIVE}$ in the following discussion.

As the stated above, the second gate electrode is in contact with the second horizontal surface of the photoactive layer on one or more contact areas. The total area of these contact areas will be referred to as the pattern area $A_{PATTERN}$. The ratio between the pattern area and the photoactive area may be referred to as the area ratio $R_A$ of the pattern:

$$R_A = \frac{A_{PATTERN}}{A_{PHOTOACTIVE}}$$

The photoactive area may be characterized by a cross-sectional distance D (for example, a diameter or diagonal). The distance from each point n on the second horizontal surface to the closest contact area in the pattern may be calculated as a fraction of this distance D. In other words, if the distance from point n to the closest contact area is $d_n$, then the corresponding fractional distance $L_n$ may be expressed as $$L_n = \frac{d_n}{D},$$

An average of this variable across all points on the second horizontal surface may be called the average fractional distance and defined as:

$$L_{AVE} = \frac{\sum_n L_n}{n},$$

may be calculated. The inverse of this average, $1/L_{AVE}$, may be referred to as the pattern coverage C of the pattern. The largest $L_n$ may be called the largest fractional distance $L_{MAX}$.

The ratio between the pattern coverage C and the area ratio $R_A$ may be called the "coverage ratio" $R_c$ of the pattern.

$$R_C = \frac{C}{R_A} = \frac{\frac{1}{L_{AVE}}}{\frac{A_{PATTERN}}{A_{PHOTOACTIVE}}} = \frac{A_{PHOTOACTIVE}}{A_{PATTERN} \cdot L_{AVE}}$$

The coverage ratio is particularly large if the pattern has a small area and the average distance from a point on the surface to the pattern is short. Large coverage ratios may be obtained with narrow patterns which extend across the entire surface.

When implementing an electrical shutter, a suitable pattern for the second gate electrode should be selected by optimizing the pattern for two conflicting requirements.

1. The pattern should have a sufficiently large area ratio and pattern coverage to set a sufficiently strong bias voltage over the junction between the channel and the photoactive layer. The electric field will spread horizontally in the photoactive layer even to areas which do not lie directly beneath or above the contact areas, but it becomes weaker at points that are more distant from the pattern if $L_{AVE}$ is large. The coverage must be sufficiently large to ensure that the junction is biased even in the points on the first horizontal surface which are most horizontally distant from the contact areas. Charge carriers may otherwise leak across the junction even when it should be in a light-immune state.

2. On the other hand, the pattern should have a sufficiently small area ratio and pattern coverage to avoid the capacitive or resistive coupling which can nullify the impact of the bias voltage.

The optimal pattern type, pattern area and pattern coverage may depend at least on 1) the second gate electrode material, 2) the material of the photoactive layer and its electrical and physical properties, such as doping level, particle size and ligands, and 3) the channel material and its electrical properties.

The optimal pattern, area and coverage will also depend very much on 4) the thickness of the photoactive layer. If the capacitance between the second gate electrode and the channel can be modelled with a simple parallel-plate capacitor, then this capacitance can be expected to decrease in proportion to the inverse of photoactive layer thickness. On the other hand, a greater bias voltage may be needed if the photoactive layer is thicker.

The thickness of the photoactive layer may be selected based on the intended measurement application. In applications where a thin photoactive layer is needed, its thickness may for example be in the range 5-50 nm, 10-50 nm, 5-25 nm or 5-10 nm. In applications where a photoactive layer of intermediate thickness is needed, its thickness may for example be in the range 50-300 nm, 100-300 nm, 50-150 nm or 100-200 nm. In applications where a thick photoactive layer is needed, its thickness may for example be in the range 300-1000 nm, 500-1000 nm, 300-500 nm or 500-800 nm.

The required bias voltage depends on the selected channel and material and photoactive material, on the thickness of the photoactive material, on the contact pattern formed by the second gate electrode, and on the intended measurement application. Suitable voltages therefore span a large interval. If a low voltage is needed, the bias voltage may for example be in the range 500 mV-1 V, 500 mV-750 mV, 750 mV-1 V or 600 mV-800 mV. If an intermediate voltage is needed, the bias voltage may for example be in the range 1 V-5 V, 1 V-2.5 V, 2.5 V-5 V or 2 V-3 V. If a high voltage is needed, the bias voltage may for example be in the range 5 V-50 V, 5 V-10 V, 10 V-20 V or 20 V-50 V.

The area ratio of the pattern may, for example, be in the range 1%-5%, 5%-10%, 10%-20%, 20%-30%, 30%-40% or 40%-50%. $L_{max}$ may, for example, be in the range 0.05-0.1, 0.1-0.2, 0.2-0.3, 0.3-0.4, or 0.4-0.5. The average $L_{ave}$ may also be in the range 0.05-0.1, 0.1-0.2, 0.2-0.3, 0.3-0.4, or 0.4-0.5. The pattern coverage may, correspondingly, be a number between 2 and 20.

If the photoactive layer is covered by the channel, the second gate electrode can be constructed with a horizontal main electrode which is embedded in the substrate and with vertical gate electrode elements which extend upward from the main electrode to their respective contact areas. The second gate electrode may thereby comprise a horizontal main electrode which underlies the photoactive layer, and one or more electrically conducting vertical gate electrode elements which extend from the main electrode to the second surface of the photoactive layer.

FIGS. 2-4 illustrate three different second gate electrode structures in a vertical xz-cross-section. The following pattern embodiments will illustrate different second gate electrode structures in the horizontal xy-plane. For reasons of simplicity, all other elements of the photodetector except the photoactive layer and the patterned areas of the second gate electrode will be omitted from the FIGS. 6-9.

Figure 6:
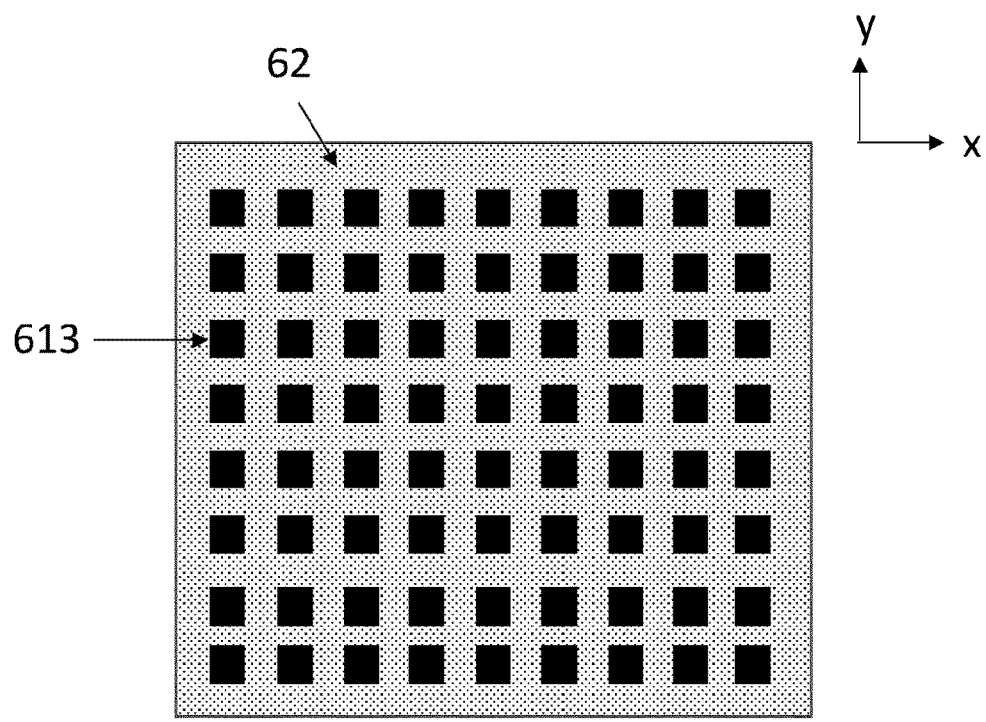
FIGS. 6-9 illustrate alternative contact patterns.

In a first pattern embodiment, the vertical gate electrode elements comprise an array of pillars, and the contact pattern comprises a corresponding array of dots. This contact pattern can be implemented in the transistor structure illustrated in FIG. 4. FIG. 6 illustrates the photoactive area of a photoactive layer 62. Each dot-shaped contact area 613 corresponds to a vertical pillar which extends from a horizontal main electrode to the surface of the photoactive layer. The number of dots, the distances between and the area of each dot may be freely chosen to optimize any of the geometrical variables specified above. The dots in an array may all have the same size, or they may have different size. Their shape may be circular, square, rectangular, or any other suitable shape.

Figure 7:
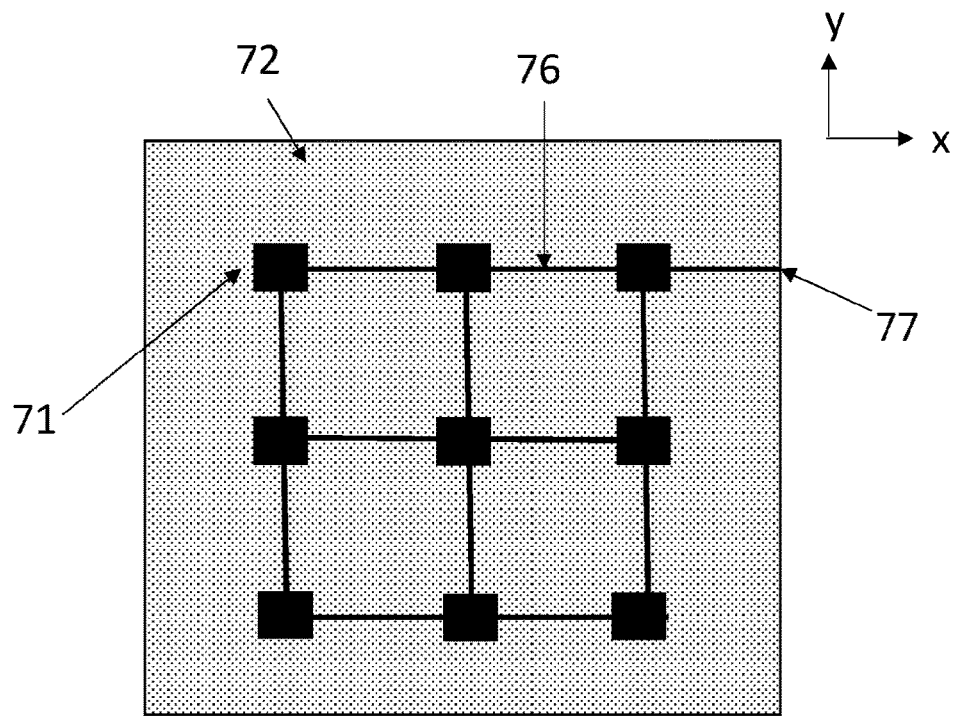

Alternatively, the second gate electrode may comprise a contact pattern with an array of dots, but no vertical gate electrode elements. This contact pattern can be implemented in the transistor structures illustrated in FIGS. 2 and 3. FIG. 7 illustrates a contact pattern where the squares 71 illustrate dot-shaped contact areas. In this case the dots must be interconnected on the surface of the photoactive layer with interconnecting electrode lines 76. The electrode lines 76 may be thin in comparison to the dimensions of the contact areas 71. Somewhere in the pattern, an electrode line extends beyond the horizontal edge of the photoactive layer 72 to the circuitry which surrounds the photosensitive transistor. This point has been illustrated with reference number 77.

Dot array contact areas, such as the ones schematically illustrated in FIGS. 6 and 7, typically obtain large coverage ratios which may maximize the performance of the second gate electrode especially if the photoactive layer is relatively thin and the photoactive area is relatively large. However, dot arrays based on vertical pillars may not be equally effective if the photoactive area is small, because there may be technical limitations to how close to each other such pillars can be placed. Furthermore, even a lower coverage ratio may be sufficient to implement an electrical shutter in smaller pixels.

Figure 8:
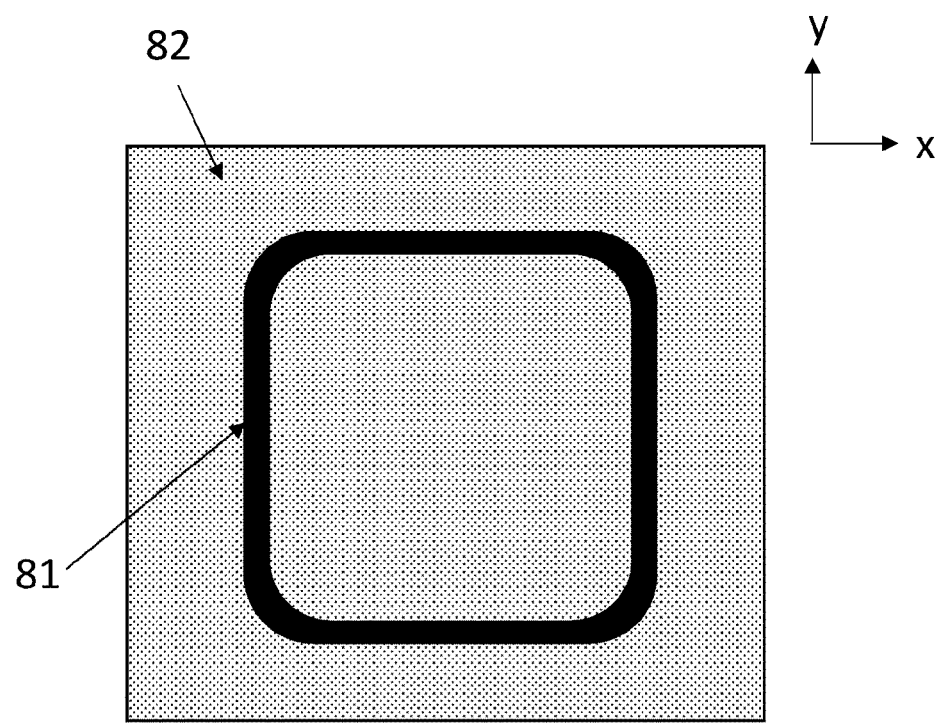

In a second pattern embodiment, the contact pattern may comprise one or more rings or rectangles. FIG. 8 illustrates schematically a photoactive area 82 and a contact pattern. The contact pattern 81 has an approximately square shape with rounded corners. The corners may also be orthogonal. Any other round, rectangular or similar shape, may also be utilized. Multiple ring-shaped patterns may be present on the area, so that one ring-shaped pattern encircles another.

If the contact pattern illustrated in FIG. 8 is implemented in the transistor structures illustrated in FIGS. 2 and 3, an electrode line which traverses the horizontal edge of the photoactive layer 82 and makes contact to the circuitry around the transistor is needed. This line has not been illustrated in FIG. 8. In other words, the contact pattern may include electrically conducting electrode lines which extend to a horizontal edge of the photoactive layer. If the pattern includes multiple ring-shaped patterns, it may also comprise interconnecting electrode lines between the ring-shaped patterns.

If the contact pattern illustrated in FIG. 8 is implemented in the transistor structures illustrated in FIG. 4, the one or more vertical gate electrode elements may comprise one or more cylindrical or rectangular shells. If the contact pattern is square on the second surface of the photoactive layer, then the corresponding vertical gate electrode element below the pattern may be a cuboid shell. In this context, the term "shell" refers to the fact that the vertical gate electrode element must have a hollow mid-section, so that the area enclosed within the contact pattern 81 in FIG. 8 is not a part of the contact pattern. The width of the ring-shaped contact pattern(s) and the diagonal dimensions of the ring-shaped contact pattern(s) may be optimized based on any of the geometrical variables discussed above.

Figure 9:
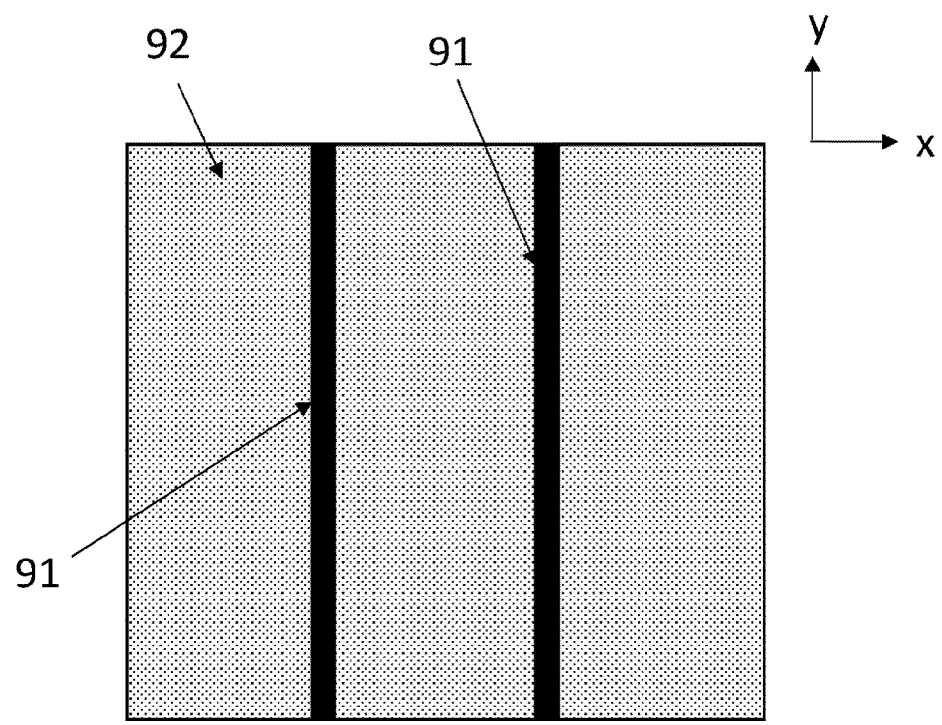

In some cases, the primary design consideration may be to create simple routing between adjacent phototransistor pixels. The contact pattern may then comprise one or more parallel lines which extend across the second horizontal surface of the photoactive layer. FIG. 9 illustrates a contact pattern where two parallel line electrodes 91 extend across the photoactive area 92. If the contact pattern illustrated in FIG. 9 is implemented in the transistor structures illustrated in FIGS. 2 and 3, no further elements may be needed in the second gate electrode.

If the contact pattern illustrated in FIG. 9 is implemented in the transistor structures illustrated in FIG. 4, the one or more vertical gate electrode elements may comprise one or more parallel walls, and the horizontal contact pattern may comprise corresponding one or more parallel lines. The width, number and spacing of the lines in the pattern may be optimized based on any of the geometrical variables discussed above.

Figure 10:
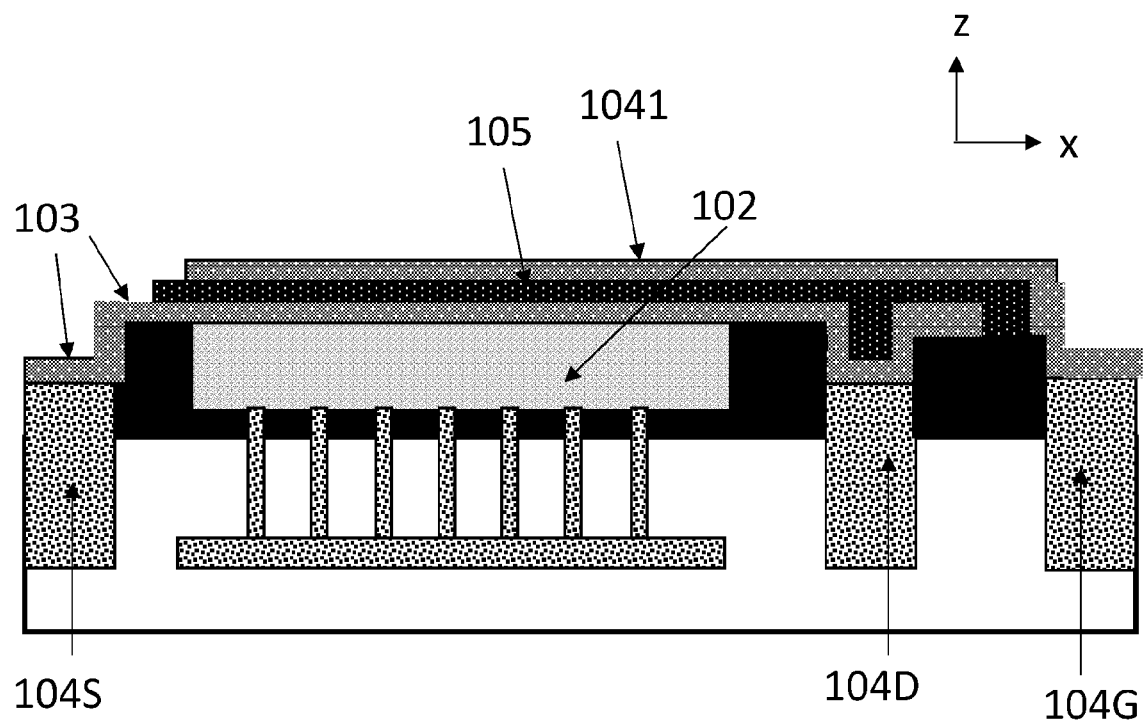
FIG. 10 illustrates a photosensitive field-effect transistor where the first gate electrode comprises graphene.

In the embodiments illustrated in FIGS. 3 and 4, where the first gate electrode overlies the transistor channel and the second gate electrode underlies the transistor channel, the first gate electrode may be implemented with a layer of graphene. FIG. 10 illustrates a configuration similar to the one in FIG. 4. The channel 103 extends from the source electrode 104S to the drain electrode 104D. An insulating layer 105 at least partly covers the channel 103.

If the capacitive coupling cannot be sufficiently reduced with a bias voltage applied to the second gate electrode, the voltage applied to the first gate electrode may also be used to compensate the coupling effect from the second gate. The control unit may be configured to steer a voltage source which applies a first gate voltage to the first gate electrode and a second gate voltage to the second gate electrode. The electric potential of the first gate electrode may be called the first gate potential, and the electric potential of the second gate electrode may be called the second gate potential. The first gate potential may be used to set the source-drain current to a desired value before a radiation intensity measurement is performed, or to shift the source-drain current between several desired values when successive measurements are performed. Furthermore, the first gate potential may be optimized relative to the second gate potential so that the phototransistor operates within its maximum dynamic range, as described in more detail below with reference to FIG. 13.

In FIG. 10, the at least one horizontal electrically conducting first gate electrode comprises a graphene layer 1041 which overlies the transistor channel 103 on the first side of the transistor channel. In other words, the first gate electrode comprises a layer of graphene 1041 which overlies the photoactive layer 102 and at least partly covers the insulating layer 105. The layer of graphene 1041 extends over the edge of the insulating layer to a contact electrode 104G on the surface of the substrate. The benefit of using a graphene layer in the first gate electrode is that the insulating layer 105 can be very thin, for example less than 20 nm or less than 10 nm thick, since graphene dos not flow easily through pin holes.

A thin insulating layer strengthens the coupling of the first gate electrode to the graphene layer, which may relax the design requirements relating to reduction of coupling between the second gate electrode and the graphene layer, because the direct capacitive coupling effect to graphene layer from second gate electrode is proportional also to the ratio of the capacitance of the second gate electrode to the capacitance of the first gate electrode.

The transparency of the top layers in the photosensitive resistor can also be increased when layers 105 and 1041 are very thin, and the graphene layer 1041 can serve as an antireflection material. An overlying graphene layer can also be utilized in the first gate electrode in the structure illustrated in FIG. 3.

Figure 11A:
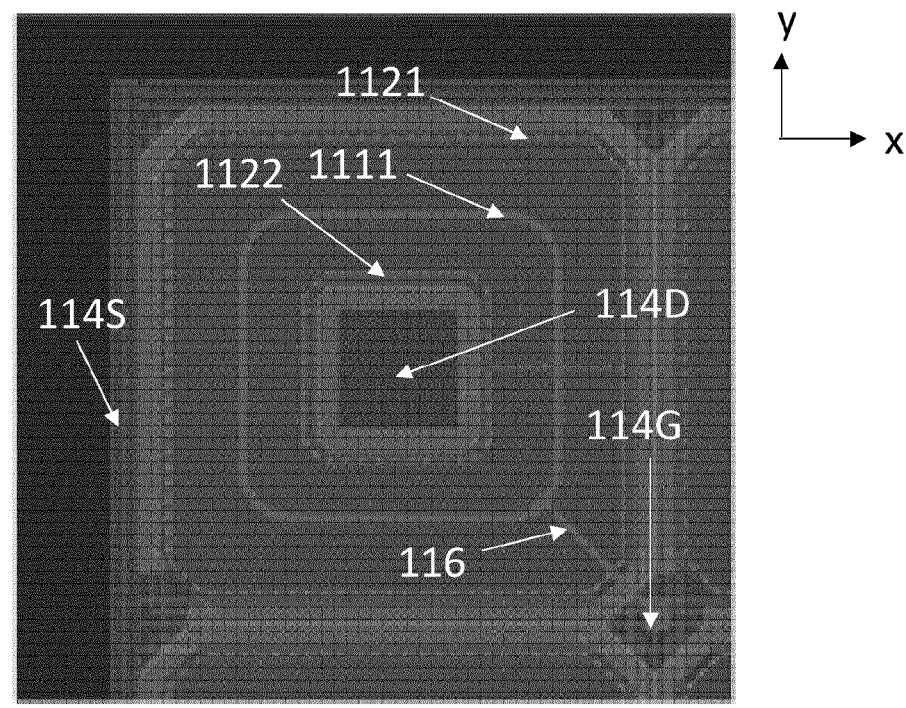
FIGS. 11a-11e illustrate pixel geometries.

FIGS. 11a-11e illustrate pixel geometries for photosensitive field-effect transistors employing the structure illustrated in FIG. 2, where the contact pattern of the second gate electrode covers the photoactive layer. These figures have been drawn to scale. In all of these figures, the source contact 114S is at the edge of the pixel, the drain contact 114D in the middle, and the second gate electrode is connected to the surrounding electric circuitry at a main electrode 114G, as illustrated in FIG. 11a. The photoactive area is delimited by the dotted lines 1121 and 1122 and it is itself shaped like a ring which surrounds the drain contact in the horizontal plane.

Figure 11B:
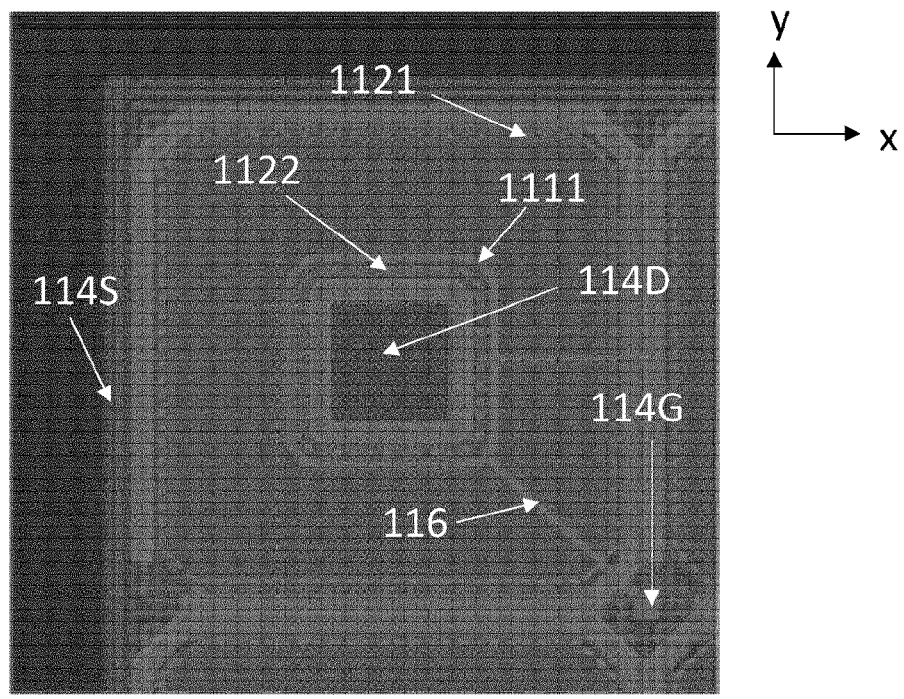
Figure 11C:
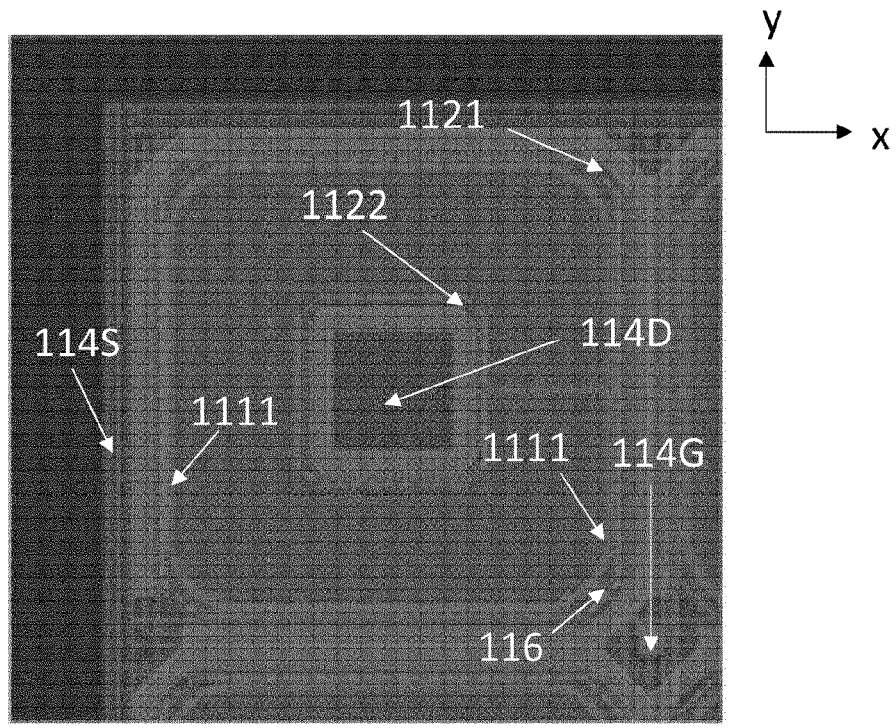

FIG. 11a illustrates a pixel geometry where the contact pattern of the second gate electrode on the photoactive layer comprises one centroid ring 1111 placed approximately in the middle between lines 1121 and 1122. The pattern also comprises an electrode line 116 which extends from the ring 1111 to the main electrode 114G. FIG. 11b illustrates a similar contact pattern where the ring 1111 has been placed on the inner edge of the photoactive area, close to the drain electrode 114D in the center. FIG. 11c illustrates a similar contact pattern where the ring 1111 has been placed on the outer edge of the photoactive area.

Figure 11D:
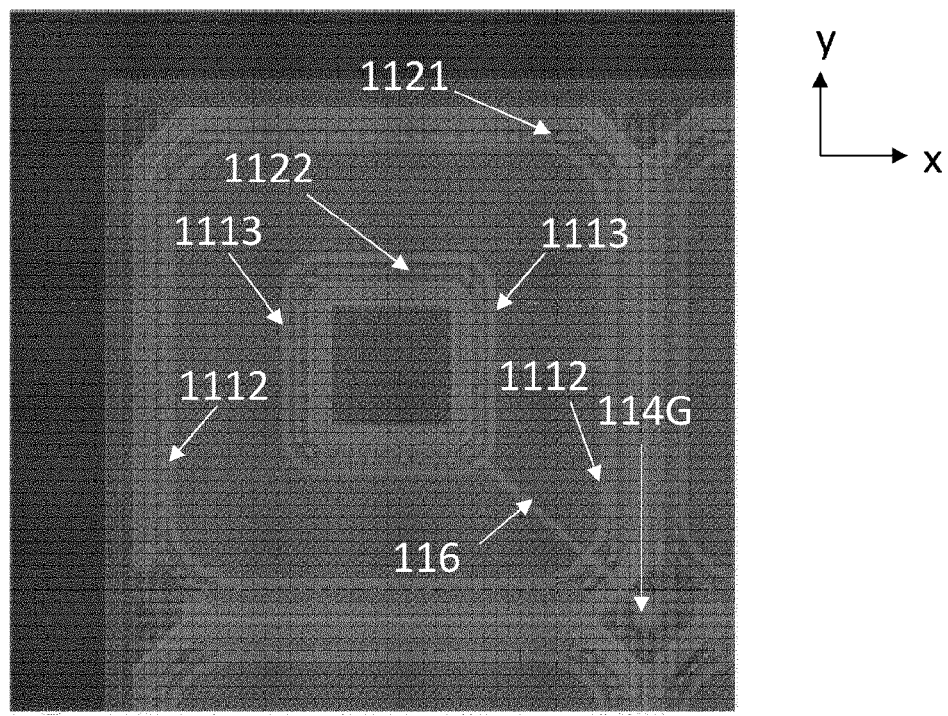

FIG. 11d illustrates a contact pattern with two rings 1112 and 1113, a first ring 1112 placed on the outer edge of the photoactive area and a second ring 1113 placed on the inner edge of the photoactive area. The electrode line 116 extends to both the first ring 1112 and to the second ring 1113.

Figure 11E:
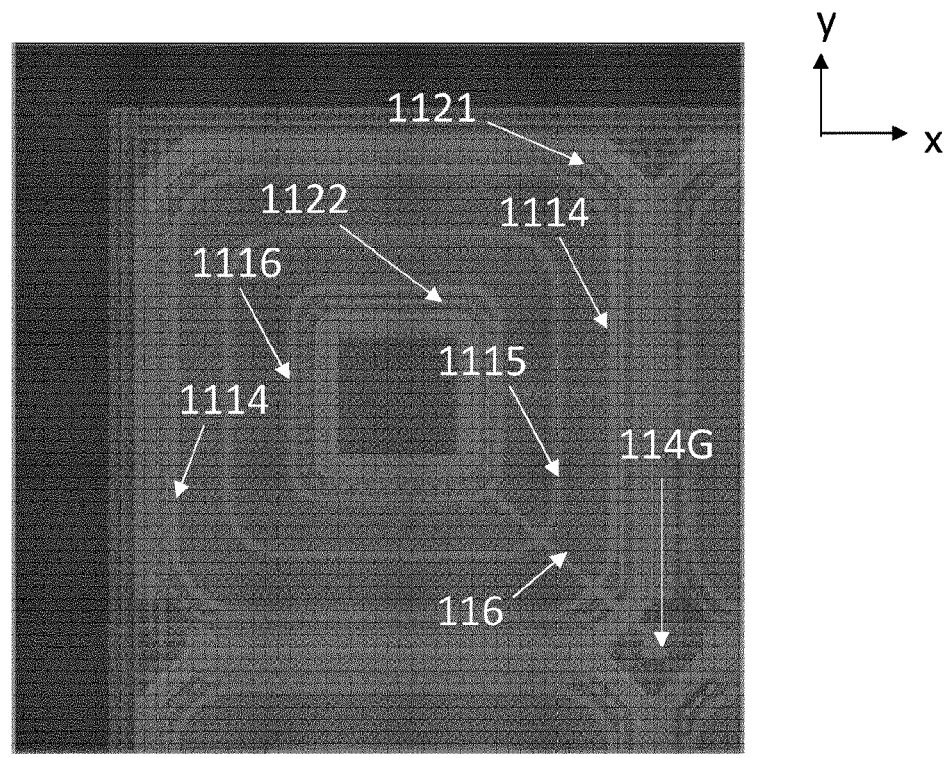

FIG. 11e illustrates a contact pattern with three rings 1114, 1115 and 1116, a first ring 1114 placed on the outer edge of the photoactive area, a second ring 1115 placed in the middle of the photoactive area, and a third ring 1116 placed on the inner edge of the photoactive area. The electrode line 116 extends to all three rings 1114-1116.

This disclosure also relates to a method for sampling a response signal from a photosensitive field-effect transistor which can be configured to provide an electrical response when illuminated by electromagnetic radiation incident on the transistor. The photosensitive field-effect transistor comprises at least one electrically conducting source electrode and at least one electrically conducting drain electrode, and a layer of two-dimensional material which forms a horizontal transistor channel configured to transport current between the at least one source electrode and the at least one drain electrode. The photosensitive field-effect transistor also comprises at least one horizontal electrically conducting first gate electrode which overlies or underlies the transistor channel on a first side of the transistor channel, and at least one gate-insulating layer between the first gate electrode and the transistor channel. The photosensitive field-effect transistor also comprises a horizontal photoactive layer with a first horizontal surface and a second horizontal surface, wherein at least a part of the first horizontal surface of the photoactive layer is in contact with a second side of the transistor channel. The photoactive layer can be configured to donate charge carriers to the transistor channel when electromagnetic radiation is absorbed in the photoactive layer.

The photosensitive field-effect transistor also comprises a second gate electrode which is in contact with the second horizontal surface of the photoactive layer on one or more contact areas. The contact areas together form a contact pattern on the second surface of the photoactive layer. the method comprises the steps of measuring a first signal value from the photosensitive field-effect transistor when a voltage which sets the junction between the transistor channel and the photoactive layer into reverse bias is applied to the second gate electrode, and measuring a corresponding second signal value from the photosensitive field-effect transistor when a voltage which sets the junction between the transistor channel and the photoactive layer into forward bias is applied to the second gate electrode.

In this context, the "corresponding" second signal value may refer to a value which is paired with the first signal value in one CDS-sampling. The first signal value may be measured in a light-sensitive state and the second in a light-immune state, or vice versa. As explained above, depending on the materials chosen for the different components in the photosensitive field-effect transistor, forward bias may either set the photoactive layer in a light-sensitive state, or in a light-immune state. Reverse bias may correspondingly create either a light-immune state, or a light-sensitive state.

The photosensitive field-effect transistor may form a pixel in a photodetector which may comprise multiple pixels of the same kind. The photodetector may also comprise a control unit which is configured to apply a bias voltage between the transistor channel and the second gate electrode in the photosensitive transistor. The control unit may be configured to perform the method presented above by altering the bias voltage. The control unit thereby switches the photosensitive transistor between a light-sensitive state and a light-immune state. The control unit may also be configured to measure and store the signal values.

The voltage applied to the second gate electrode is a bias voltage between the channel and the second gate electrode. As explained above, the magnitude of the voltage required for biasing the junction sufficiently depends on the contact pattern, on the thickness of the photoactive layer and on the materials chosen for the channel, the photoactive layer and the second gate electrode.

The first signal value may be measured before the corresponding second signal value. Alternatively, the second signal value may be measured before the corresponding first signal value. One of the first and second signal values is a dark value and the other one is light value, and the light value may be measured before the corresponding dark value. Alternatively, the dark value may be measured before the light value.

The quickness of the electrical reset achieved with a patterned second gate electrode is a key benefit of an electrical shutter. When a response signal is sampled, it allows the dark value which is measured in the light-immune state to be measured very soon after the light value was measured in the light-sensitive state.

Figure 12A:
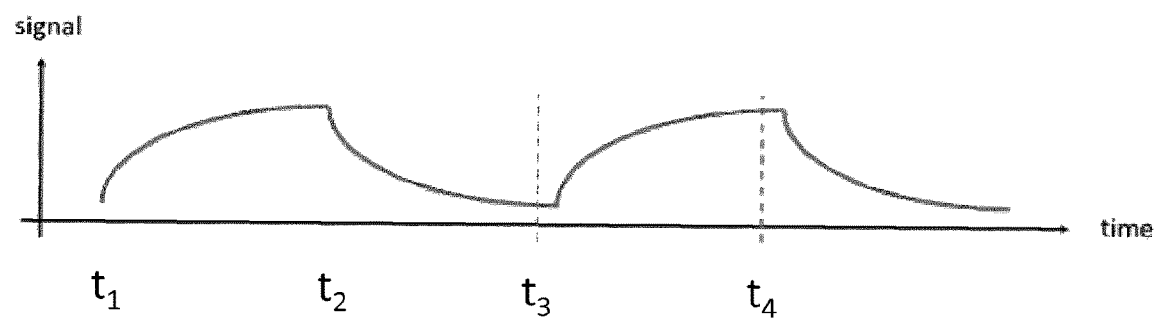
FIG. 12a illustrates the response signal of a photosensitive field-effect transistor when a mechanical shutter is used.
Figure 12B:
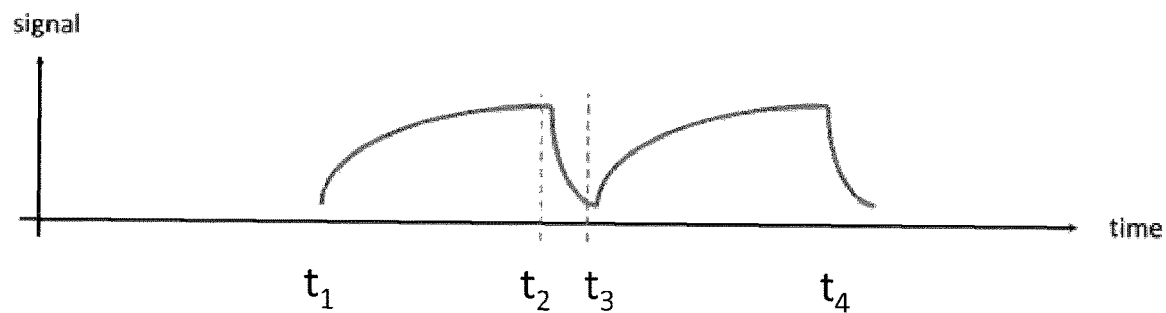
FIG. 12b illustrates the response signal of a photosensitive field-effect transistor when an electrical shutter is used.

FIGS. 12a and 12b illustrate schematically the response signal (i.e. the source-drain current) of an illuminated photosensitive transistor as a function of time, sampled with correlated double-sampling.

FIG. 12a illustrates a typical CDS-sampling in a phototransistor with a two-dimensional channel layer when a mechanical shutter is used. The signal curve begins at time $t_1$. A reset is started at $t_2$, but it takes a long time before the signal finally reaches its dark value at $t_3$. The shortest possible time period between the measurement of the light value and the measurement of the dark value is obtained when the dark value is measured at $t_3$, and then the corresponding light value at $t_4$. In other words, the dark value is typically measured before the light value because the charge accumulation time is shorter than the charge dissipation time. But the time period between the dark and light measurements has to be at least as long as the charge accumulation time indicated as a rising signal value in FIG. 12a.

FIG. 12b illustrates CDS-sampling in a phototransistor with an electrical shutter according to the present disclosure. The signal curve begins at time $t_1$. As the multiplicative effect of the photoactive layer is activated, more and more charge accumulates in the channel and the response signal gradually increases to the value which corresponds to the intensity of the incident light. At $t_2$ the response signal has obtained its steady-state value under this intensity, and the light value is measured. The transistor is then electrically reset with the second gate electrode, and the dark value can be measured at time $t_3$. The time period between $t_2$ and $t_3$ is very short when an electrical shutter is used. CDS-sampling can therefore be carried out in the other order: the light value can be measured first, and the dark value shortly thereafter. This makes the CDS-sampled value very reliable.

The main benefit of this method is that the time needed for CDS operation is shortened: the time interval $t_3-t_2$ is considerably shorter than the interval $t_2-t_1$ (FIG. 12b). In low light intensity conditions, the exposure time period $t_2-t_1$ should be as long as possible, within the limits of required picture frame rate, to maximize the number of detected photons by the photoactive layer. In a so-called global shutter, all pixels in an array are exposed to light at the same point in time. This eliminates distortion to images when capturing moving objects and is usually a required feature for machine vision. The shutter functionality should be implemented into each pixel with minimum complexity. Implementing it with the transistor devices and methods described in this disclosure creates an electronic global shutter without any external components. When this electronic global shutter functionality is implemented, the time needed to hold the signal in sensitive analogue electronics structures is shortened considerably. This improves performance and allows smaller pixel geometries and larger arrays. It also allows CDS operation to better reduce low frequency noise and drifting by reducing the time between successive samples.

In the preceding discussion, it was generally assumed that the second gate electrode should be set to a second gate potential which puts the photosensitive field-effect transistor in a light-immune state. In this-light immune state, even under illumination, the device response signal is equal to what the response signal would be if the device would be placed fully in the dark.

However, it can sometimes be difficult to align the response signal in the light immune state precisely at the value which would be obtained at the dark/light threshold where a minimal amount of light strikes the device. When the device is switched to a light-sensitive state, the device may inadvertently remain in a light-immune state longer than it would if it really had been in the dark. In other words, it can sometimes be difficult to utilize the full measurement range of the photosensitive field-effect transistor when an electric shutter is used.

Depending on how the readout electronics (such as pre-amplifiers and analog-to-digital converters) are configured for sampling the response signal, it can sometimes be more beneficial to perform CDS measurements with a reference value (or reset value) which differs from the sensor response which would be obtain in fully dark conditions. In this case, the reference value does not correspond to a light-immune state, but simply to a reference state against which other response values may be compared.

The reference state may be quite freely selected by simultaneously setting the first gate potential and the second gate potential to suitable values. In other words, when performing CDS measurements the control unit may be configured toggle the first gate voltage between a first reference voltage and a first measurement voltage. The control unit may be configured to simultaneously toggle the second gate voltage between a corresponding second reference voltage value and second measurement voltage.

When the first reference voltage and the second reference voltage are simultaneously applied to the first and second gate electrodes, respectively, the device may be put in a reference state where its response signal always takes on the same constant reference value (regardless of illumination). When the first measurement voltage and the second measurement voltage are simultaneously applied to the first and second gate electrodes, respectively, the device may be put in a measurement state where its response signal is proportional to the intensity of the incident illumination.

It is significant that the magnitude of the constant reference value can be adjusted by changing the first reference voltage and the second reference voltage. This allows the constant reference value to be placed for example in the middle of the measurement range of the photosensitive field-effect transistor (assuming that a maximum intensity can be determined). The signal-to-noise ratio of the device may thereby be improved.

A differential CDS signal may optionally be retrieved from the sensor as a series of data points where each point expresses the difference between a light value and dark value. Each light-dark value pair is measured in quick succession for example in the manner illustrated in FIG. 12b.

Figure 13:
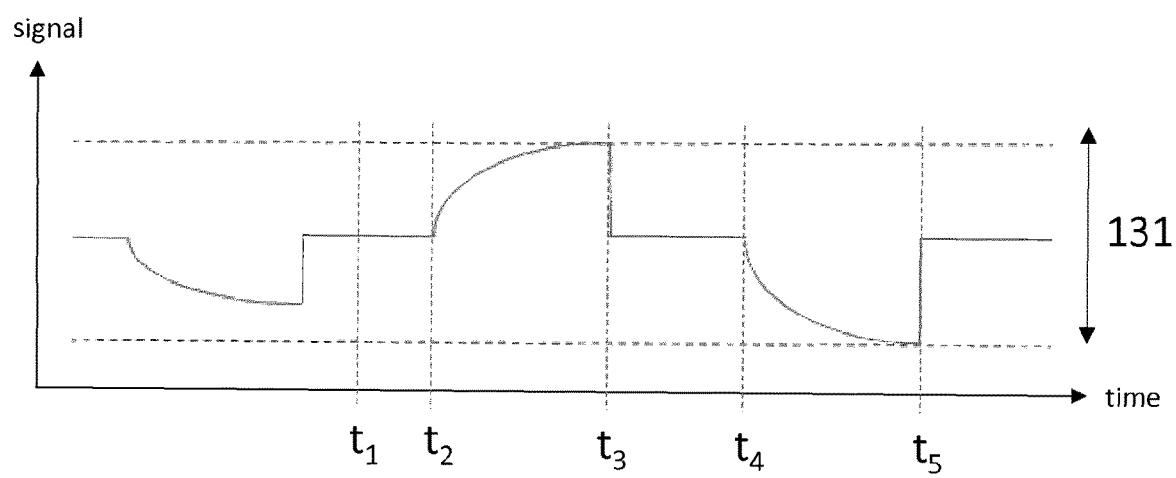
FIG. 13 also illustrates the response signal of a photosensitive field-effect transistor when an electrical shutter is used.

FIG. 13 illustrates schematically the response signal of an illuminated photosensitive transistor as a function of time. The range 131 corresponds to the full measurement range of the photosensitive field-effect transistor. At time $t_1$, the signal has been set to a constant reference state which lies in the middle of the measurement range. At time $t_2$, the first gate voltage and second gate voltage are set to the first and second measurement voltage, respectively. In this case, the light intensity is high, and the signal increases to a value which is larger than the reference value.

At time $t_3$, the first and second gate voltages are again set to the first reference voltage and the second reference voltage, respectively. CDS sampling can be conducted just before and after $t_3$. The device the returns to its reference state at $t_3$. At time $t_4$, the first gate voltage and second gate voltage are again set to the first and second measurement voltage, respectively and the next CDS sampling can be conducted just before and after $t_5$. This time the signal decrease from its reference value after $t_4$ because the light intensity is low.

When the photosensitive field-effect transistor is in set to a constant reference state exactly in the middle of the measurement range, the readout electronics may be configured to obtain a differential CDS signal from the device. This can sometimes be a simpler path to utilizing the full measurement range of the transistor than to align the electric light-immune state precisely with the state of the transistor on the threshold between light and dark.

Figure 14A:
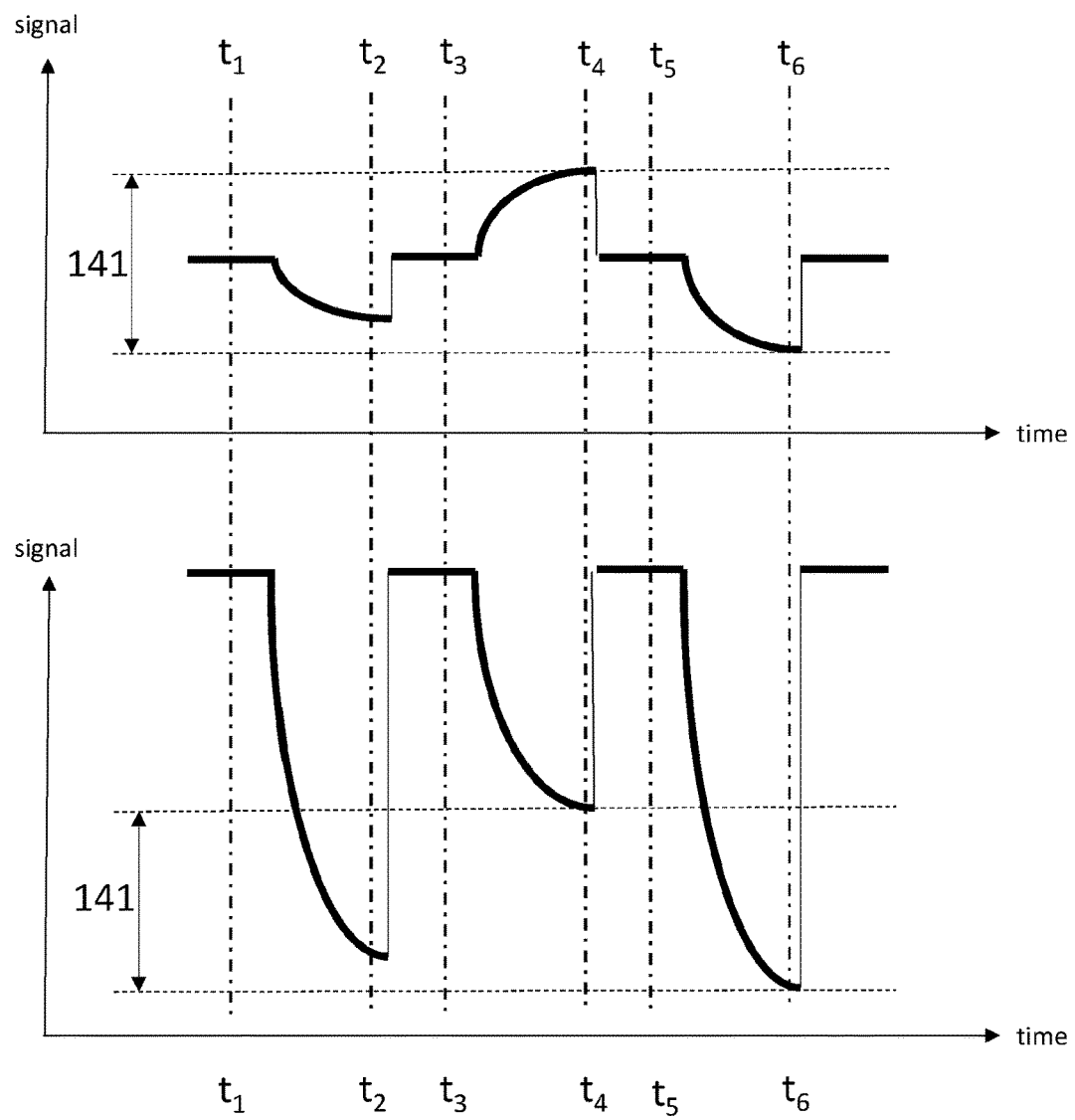
FIGS. 14a-14c illustrate measurement signals in a fully differential signal path.

FIG. 14a shows an illustrative comparison between the signal curve from FIG. 13 shown on top, where the reference state is set to the middle of the maximal measurement range 141. The same figure also shows another signal curve on the bottom obtained from a device where the reference state is a light-immune state which lies relatively far from the boundary of the measurement range. In the bottom curve, the measurement range only covers a part of the signal curve. The measurements conducted at $t_2$ and $t_6$ at relatively high intensities are registered, but exposure to low intensity radiation at time $t_4$ does not register as a measurement signal because this intensity is insufficient for shifting the transistor from its reference state at $t_3$ to a state within the measurement range.

Figure 14B:
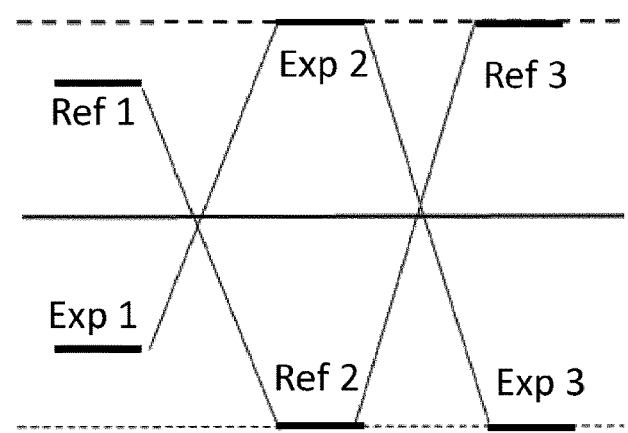
Figure 14C:
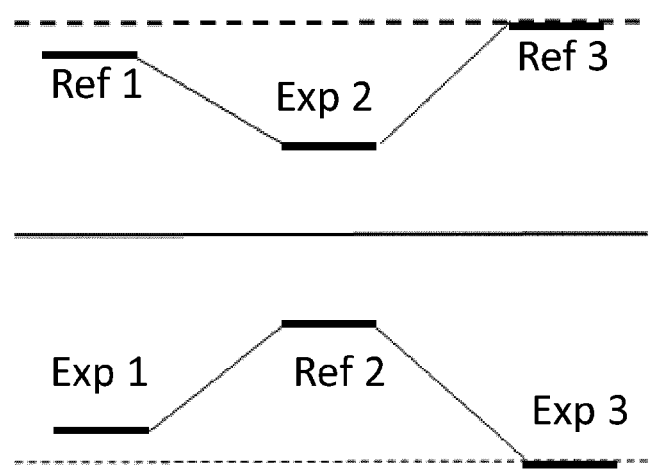

FIG. 14b illustrates the measurement signal illustrated in the upper part of FIG. 14a after CDS in a fully differential signal path. The Ref 1 value was measured at $t_1$, Exp 1 at $t_2$, Ref 2 at $t_3$, Exp 2 at $t_4$, Ref 3 at $t_5$ and Exp 3 at $t_6$. FIG. 14c illustrates the measurement signal illustrated in the lower part of FIG. 14a after CDS in a fully differential signal path, where each reference (Ref) and exposure (Exp) value has been measured at the times indicated above for FIG. 14b. It can be seen in FIG. 14c that there is an unused signal area in the middle, while the signal space is utilized fully in FIG. 14b.

The invention claimed is:

1. A method for sampling a response signal from a photosensitive field-effect transistor configured to provide an electrical response when illuminated by electromagnetic radiation incident on the transistor, and which comprises:
   at least one electrically conducting source electrode and at least one electrically conducting drain electrode,
   a layer of two-dimensional material which forms a horizontal transistor channel configured to transport current between the at least one source electrode and the at least one drain electrode,
   at least one horizontal electrically conducting first gate electrode which overlies or underlies the transistor channel on a first side of the transistor channel, and at least one gate-insulating layer between the first gate electrode and the transistor channel, and
   a horizontal photoactive layer with a first horizontal surface and a second horizontal surface, wherein at least a part of the first horizontal surface of the photoactive layer is in contact with a second side of the transistor channel, and the area of the second horizontal surface is a photoactive area, and the photoactive layer is configured to donate charge carriers to the transistor channel when electromagnetic radiation is absorbed in the photoactive layer,
   wherein the photosensitive field-effect transistor also comprises a second gate electrode which is in contact with the second horizontal surface of the photoactive layer on one or more contact areas, wherein the one or more contact areas form a contact pattern on the second horizontal surface of the photoactive layer so that the total area of the one or more contact areas is a pattern area, and the ratio between the pattern area and the photoactive area is in the range 1%-50%, and
   wherein the method comprises the steps of measuring a first signal value from the photosensitive field-effect transistor when a voltage which sets the junction between the transistor channel and the photoactive layer into reverse bias is applied to the second gate electrode, and measuring a corresponding second signal value from the photosensitive field-effect transistor when a voltage which sets the junction between the transistor channel and the photoactive layer into forward bias is applied to the second gate electrode.

2. The method according to claim 1, wherein one of the first and second signal values is a dark value and the other one is light value, and the light value is measured before the corresponding dark value.

3. A photosensitive field-effect transistor configured to provide an electrical response when illuminated by electromagnetic radiation incident on the transistor, wherein the photosensitive field-effect transistor comprises:
   at least one electrically conducting source electrode and at least one electrically conducting drain electrode,
   a layer of two-dimensional material which forms a horizontal transistor channel configured to transport current between the at least one source electrode and the at least one drain electrode,
   at least one horizontal electrically conducting first gate electrode which overlies or underlies the transistor channel on a first side of the transistor channel, and at least one gate-insulating layer between the first gate electrode and the transistor channel,
   a horizontal photoactive layer with a first horizontal surface and a second horizontal surface, wherein at least a part of the first horizontal surface of the photoactive layer is in contact with a second side of the transistor channel, and the area of the second horizontal surface is a photoactive area, and the photoactive layer is configured to donate charge carriers to the transistor channel when electromagnetic radiation is absorbed in the photoactive layer, wherein the photosensitive field-effect transistor also comprises a second gate electrode which is in contact with the second horizontal surface of the photoactive layer on one or more contact areas, whereby the one or more contact areas form a contact pattern on the second horizontal surface of the photoactive layer so that the total area of the one or more contact areas is a pattern area, and the ratio between the pattern area and the photoactive area is in the range 1%-50%.

4. A photodetector comprising at least one photosensitive field-effect transistor according to claim 3, and the photodetector also comprises a voltage source connected between the channel and the second gate electrode in the at least one photosensitive field-effect transistor, and the photodetector comprises a control unit which is configured to operate an electrical shutter on the at least one photosensitive field-effect transistor by switching the photosensitive field-effect transistor between a light-sensitive state and a light-immune state by applying to the transistor a bias voltage through the voltage source.

5. The photosensitive field-effect transistor according to claim 3, wherein the at least one horizontal electrically conducting first gate electrode comprises a graphene layer which overlies the transistor channel on the first side of the transistor channel.

6. The photosensitive field-effect transistor according to claim 3, wherein the contact pattern comprises one or more parallel lines which extend across the second horizontal surface of the photoactive layer.

7. The photosensitive field-effect transistor according to claim 3, wherein the contact pattern comprises one or more rings or rectangles.

8. The photosensitive field-effect transistor according to claim 7, wherein the contact pattern includes electrically conducting electrode lines which extend to a horizontal edge of the photoactive layer.

9. The photosensitive field-effect transistor according to claim 3, wherein the second gate electrode also comprises a horizontal main electrode which underlies the photoactive layer and one or more electrically conducting vertical gate electrode elements which extend from the main electrode to the second surface of the photoactive layer.

10. The photosensitive field-effect transistor according to claim 9, wherein the one or more vertical gate electrode elements comprise one or more cylindrical or rectangular shells, and the contact pattern comprises corresponding one or more rings or rectangles.

11. The photosensitive field-effect transistor according to claim 9, wherein the one or more vertical gate electrode elements comprise one or more parallel walls, and the horizontal contact pattern comprises corresponding one or more parallel lines.

12. The photosensitive field-effect transistor according to claim 9, wherein the vertical gate electrode elements comprise an array of pillars, and the contact pattern comprises a corresponding array of dots.

* * * * *